US007398949B2

(12) United States Patent  (10) Patent No.: US 7,398,949 B2
Weech et al.  (45) Date of Patent: Jul. 15, 2008

(54) ELECTRONIC HARDWARE MOUNTING BRACKET

(75) Inventors: Jonathan C. Weech, Star, ID (US); Martin B. Albini, Bozeman, MT (US)

(73) Assignee: Dedicated Devices, Inc., Boise, ID (US)

( * ) Notice: Subject to any disclaimer, the term of this patent is extended or adjusted under 35 U.S.C. 154(b) by 131 days.

(21) Appl. No.: 11/056,526

(22) Filed: Feb. 11, 2005

(65) Prior Publication Data

US 2006/0180725 A1  Aug. 17, 2006

(51) Int. Cl.
 F21V 21/00  (2006.01)
(52) U.S. Cl. ............ 248/220.21; 248/300; 248/906; 220/3.5; 220/3.9; 174/58
(58) Field of Classification Search ............ 248/220.21, 248/200, 220.41, 220.42, 220.43, 222.11, 248/225.21, 300, 906; 174/58, 63, 53, 57, 174/50; 220/3.9, 3.5, 3.3
See application file for complete search history.

(56) References Cited

U.S. PATENT DOCUMENTS

| 4,227,238 | A | * | 10/1980 | Saito ........................ 361/801 |
| 4,447,030 | A | * | 5/1984 | Nattel ........................ 248/27.1 |
| 4,483,453 | A | * | 11/1984 | Smolik ........................ 220/3.5 |
| 4,533,060 | A | * | 8/1985 | Medlin ........................ 220/3.9 |
| 4,964,525 | A | * | 10/1990 | Coffey et al. ................ 220/3.9 |
| 4,972,339 | A | * | 11/1990 | Gabrius ....................... 362/366 |
| 5,263,676 | A | * | 11/1993 | Medlin et al. ............... 248/300 |
| 5,448,011 | A | * | 9/1995 | Laughlin ..................... 174/480 |
| 5,451,021 | A | * | 9/1995 | Ripley ........................ 248/27.3 |
| 5,810,303 | A | * | 9/1998 | Bourassa et al. ......... 248/205.1 |
| 6,098,939 | A | * | 8/2000 | He .......................... 248/205.1 |
| 6,323,424 | B1 | * | 11/2001 | He .............................. 174/58 |
| 6,871,827 | B2 | * | 3/2005 | Petak et al. ................. 248/300 |
| 7,025,314 | B1 | * | 4/2006 | Thomas et al. ........... 248/205.1 |
| 7,053,300 | B2 | * | 5/2006 | Denier et al. ................. 174/58 |
| 2004/0211872 | A1 | * | 10/2004 | Dittmer et al. .............. 248/323 |

* cited by examiner

*Primary Examiner*—Anita M King
(74) *Attorney, Agent, or Firm*—John R. Thompson; Stoel Rives LLP

(57) ABSTRACT

A mounting bracket engages a hardware device and couples to a support structure. The mounting bracket includes a face to support the hardware device and opposing ear members coupled to the face. The ear members may include clips to engage a support structure and mounting apertures to receive fasteners.

25 Claims, 5 Drawing Sheets

ELECTRONIC HARDWARE MOUNTING BRACKET

TECHNICAL FIELD

The present invention relates to support and mounting brackets for electronic equipment.

BRIEF DESCRIPTION OF THE DRAWINGS

Non-limiting and non-exhaustive embodiments of the present invention are described in the Figures, in which.

DETAILED DESCRIPTION

The presently preferred embodiments of the present invention will be best understood by reference to the drawings, wherein like parts are designated by like numerals throughout. It will be readily understood that the components of the present invention, as generally described and illustrated in the figures herein, could be arranged and designed in a wide variety of different configurations. Thus, the following more detailed description of the embodiments of the apparatus, system, and method of the present invention, as represented in FIGS. 1 through 4, is not intended to limit the scope of the invention, as claimed, but is merely representative of presently preferred embodiments of the invention.

Figure 1:
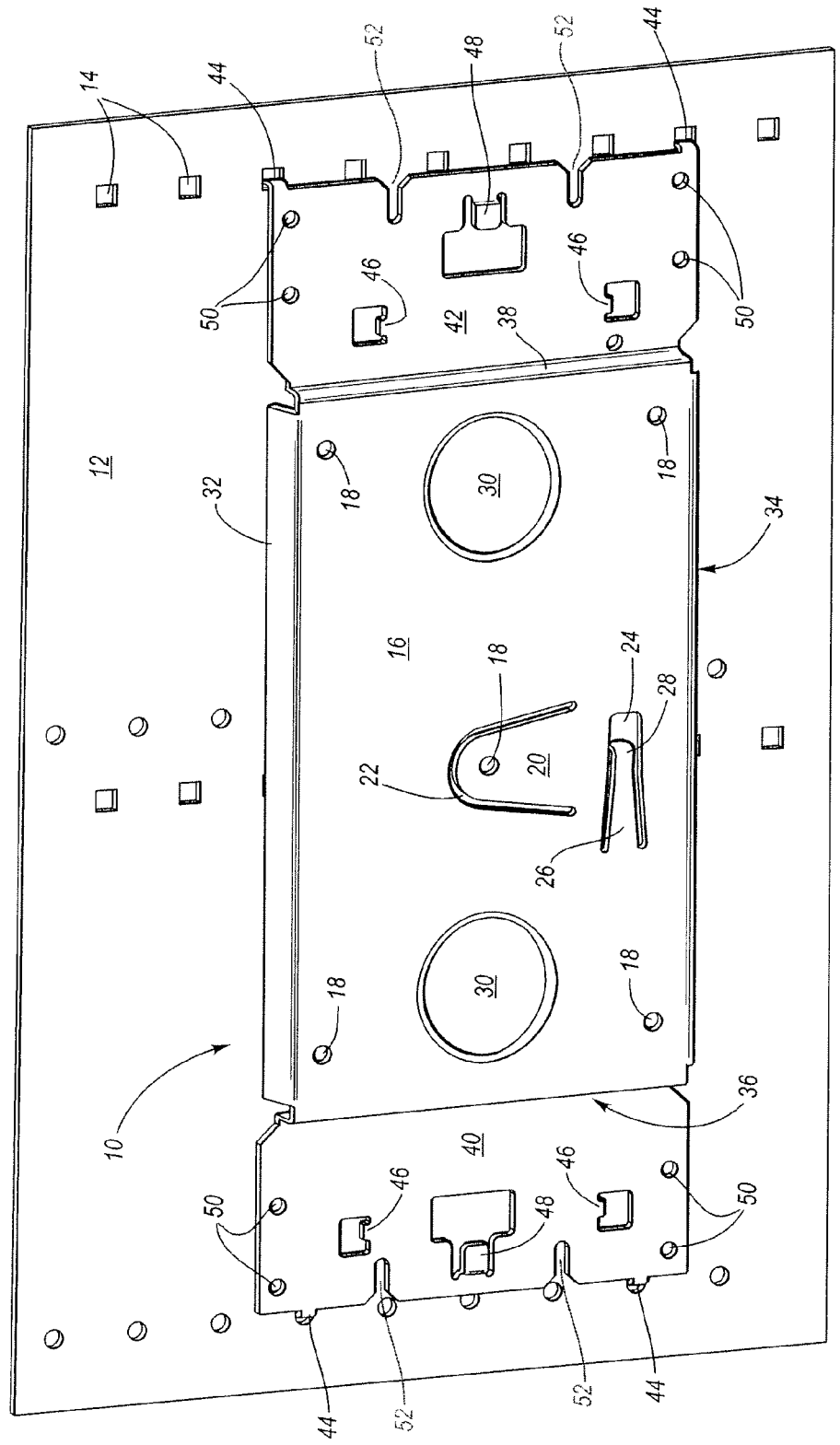
FIG. 1 is a perspective view of one embodiment of a mounting bracket.

Referring to FIG. 1, a perspective view of one embodiment of a mounting bracket 10 is shown. The mounting bracket 10 is configured to couple to a panel 12 that includes apertures 14 to receive the mounting bracket 10. Panels 12 are well known in the art and are used in enclosures to house electronic hardware. The apertures 14 may be disposed linearly in series to allow the mounting bracket 10 to be positioned in a number of locations. The mounting bracket 10 and the panel 12 may be vertically disposed.

The mounting bracket 10 includes a mounting face 16 that couples to an electronic hardware component (not shown). The mounting face 16 is substantially planar and may approximate a rectangle in shape. The mounting face 16 may include mounting apertures 18 that receive a screw, clip, prong, or other fastening device that extends from a hardware component. Alternatively, the mounting face 16 may include extending members that engage a hardware component. In the illustrated embodiment, a mounting aperture 18 is disposed in each corner of the mounting face 16.

A central mounting aperture 18 is disposed on an alignment spring 20. The alignment spring 20 is defined by forming a channel 22 through the mounting face 16. The alignment spring 20 is biased inward when coupling a hardware component to the mounting face 16 and thereby guides an extending member of a hardware component to the central mounting aperture 18. For purposes of discussion herein, inward is defined as the direction towards an intended panel 12 and outward is defined as the direction away from an intended panel 12. Once the mounting apertures 18 receive extending members of the hardware component, the extending members may be secured by a nut or other fastening device.

The mounting face 16 may further include a central clip 24 that extends inward and is received by an aperture 14. The central clip 24 is coupled to a clip spring 26 that biases outward when the central clip 24 presses against the panel 12. When the central clip 24 engages an aperture 14, the clip spring 26 assumes a non-biased position to thereby indicate that the central clip 24 is successfully engaged. As with the alignment spring 20, the clip spring 26 is defined by a channel 28 that is formed through the mounting face 16.

The mounting face 16 may further include one or more structural apertures 30 that extend through the mounting face 16. The structural apertures 30 enhance the structural integrity of the mounting bracket 10 and provide resiliency. As illustrated, two structural apertures 30 may be symmetrically disposed on the mounting face 16.

The mounting bracket 10 may further include first and second support members 32, 34 that couple to opposing sides of the mounting face 16. The support members 32, 34 extend inward on an angle toward an intended panel 12. The support members 32, 34 support the offset position of the mounting face 16 from a panel 12. Thus, the mounting face 16 is not flush with a panel 12 but is supported some distance from the panel 12. This allows space for fastening devices that extend through the mounting face 16.

The mounting bracket 10 includes first and second coupling members 36, 38 that couple to opposing sides of the mounting face 16 and extend inward. The coupling members 36, 38 couple to first and second ear members 40, 42 respectively. When the mounting bracket 10 is coupled to the panel 12, the ear members 40, 42 are substantially flush with the panel 12 while the mounting face 16 is spaced from the panel 12. Thus, the mounting face 16 is in a non-planar configuration with the ear members 40, 42.

The ear members 40, 42 include additional components for engaging a panel 14. In the illustrated embodiment, each ear member 40, 42 includes outer clips 44 to engage apertures 12. The outer clips 44 are disposed on the perimeter of the ear members 40, 42 and extend inward. The ear members 40, 42 may further include inner clips 46 disposed within the planar surface of the ear members 40, 42 and extending inward to engage apertures 12. The outer and inner clips 44, 46 may be disposed symmetrically to provide stable engagement between the mounting bracket 10 and panel.

Each ear member 40, 42 may include horizontal clips 48 that extend outward. Horizontal clips 48 may be disposed within the planar surface of the ear members 40, 42 and couple to a different support structure as will be discussed below in reference to FIG. 3.

Each ear member 40, 42 may further include symmetrically disposed mounting apertures 50. The mounting apertures 50 may be used to secure the mounting bracket 10 to a planar surface such as wooden studs, concrete, and the like. Extending members (not shown) such as nails, screws, and other fasteners pass through the apertures 50 and engage a surface. In such a coupling, the central, outer, and inner clips 28, 44, 46 may be bent into a planar alignment to allow the ear members 40, 42 to be flush with a surface. This type of coupling is further described in reference to FIG. 4. Each ear member 40, 42 may further include inlets 52 to engage an extending member. The inlets 52 may slide into position with existing extending members or extending members may be placed through the inlets 52 after positioning. In this way, the inlets 52 may function in a manner similar to the mounting apertures 50.

The mounting bracket 10 allows for three different ways of coupling to a support structure. As illustrated, the central, outer, and inner clips 28, 44, 46 may be used to engage a panel 12. Alternatively, the horizontal clips 48 may engage an alternative support structure and retain the mounting bracket 10 in a horizontal position. The mounting bracket 10 also includes mounting apertures 50 to secure to a planar surface. In this manner, one mounting bracket 10 provides different options for secure attachment.

Figure 2:
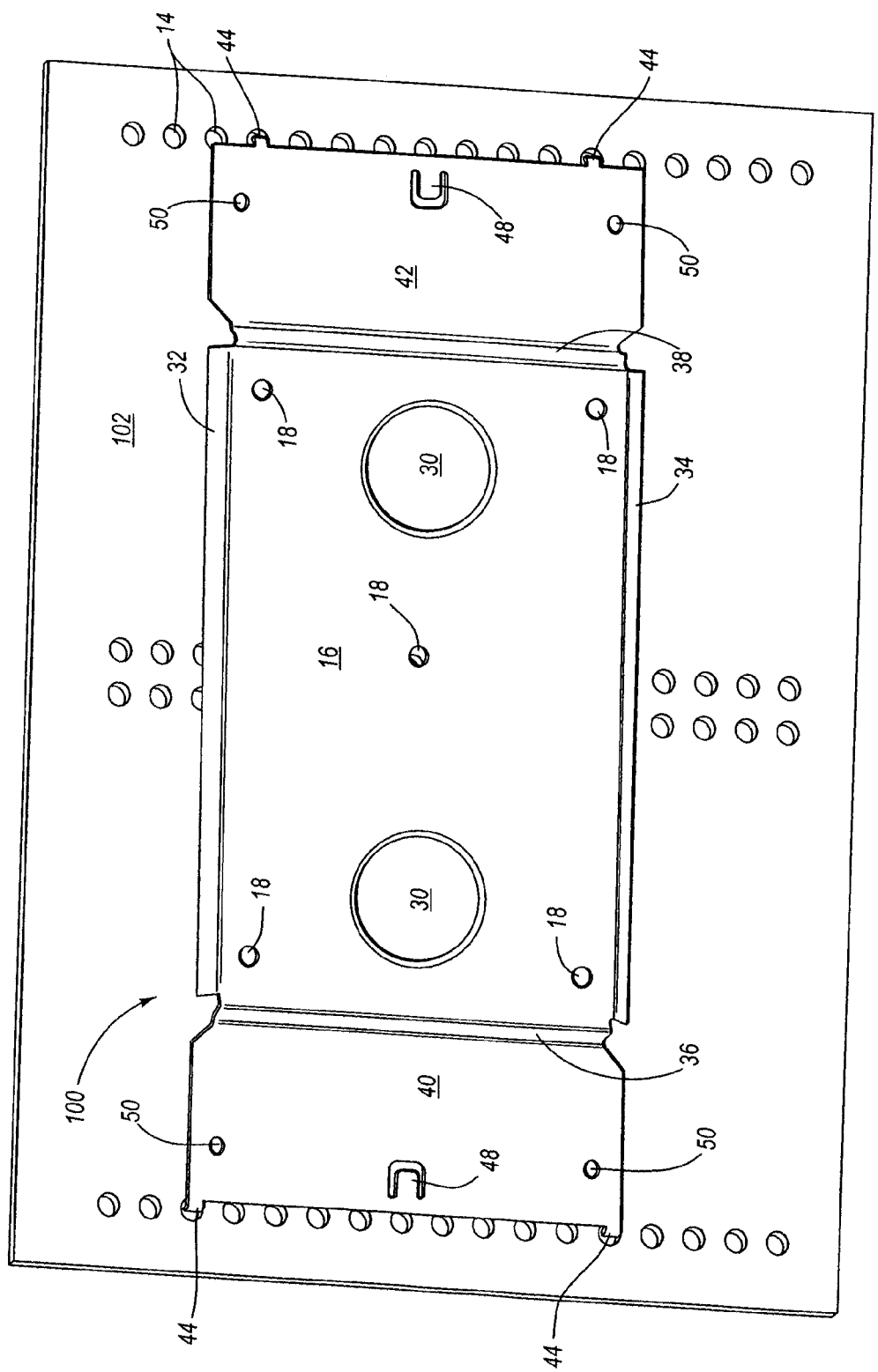
FIG. 2 is a perspective view of an alternative embodiment of a mounting bracket.

Referring to FIG. 2, an alternative embodiment of a mounting bracket 100 is shown coupled to a panel 102. The panel 102 includes a series of apertures 14 similar to that of panel 12. As in the previous embodiment, the mounting bracket 100 includes outer clips 44 disposed on ear members 44 to engage the apertures 14. The mounting bracket 100 further includes horizontal clips 48 that provide an alternative method for engaging a support structure. The mounting bracket 100 also includes mounting apertures 50 to provide yet another method for engaging a support structure.

The mounting bracket 100 does not include inner clips 46 or a central clip 24 as the outer clips 44 are sufficient to engage the panel 102. As can be appreciated, the additional clips 24, 46 increase the secure coupling of a mounting bracket to a panel. The mounting bracket 100 also does not include an alignment spring 20, central clip 18, or clip spring 26 as these are optional components. As can be appreciated by one of skill in the art, mounting brackets may include all or some of the features disclosed herein and still be within the scope of the invention.

Figure 3:
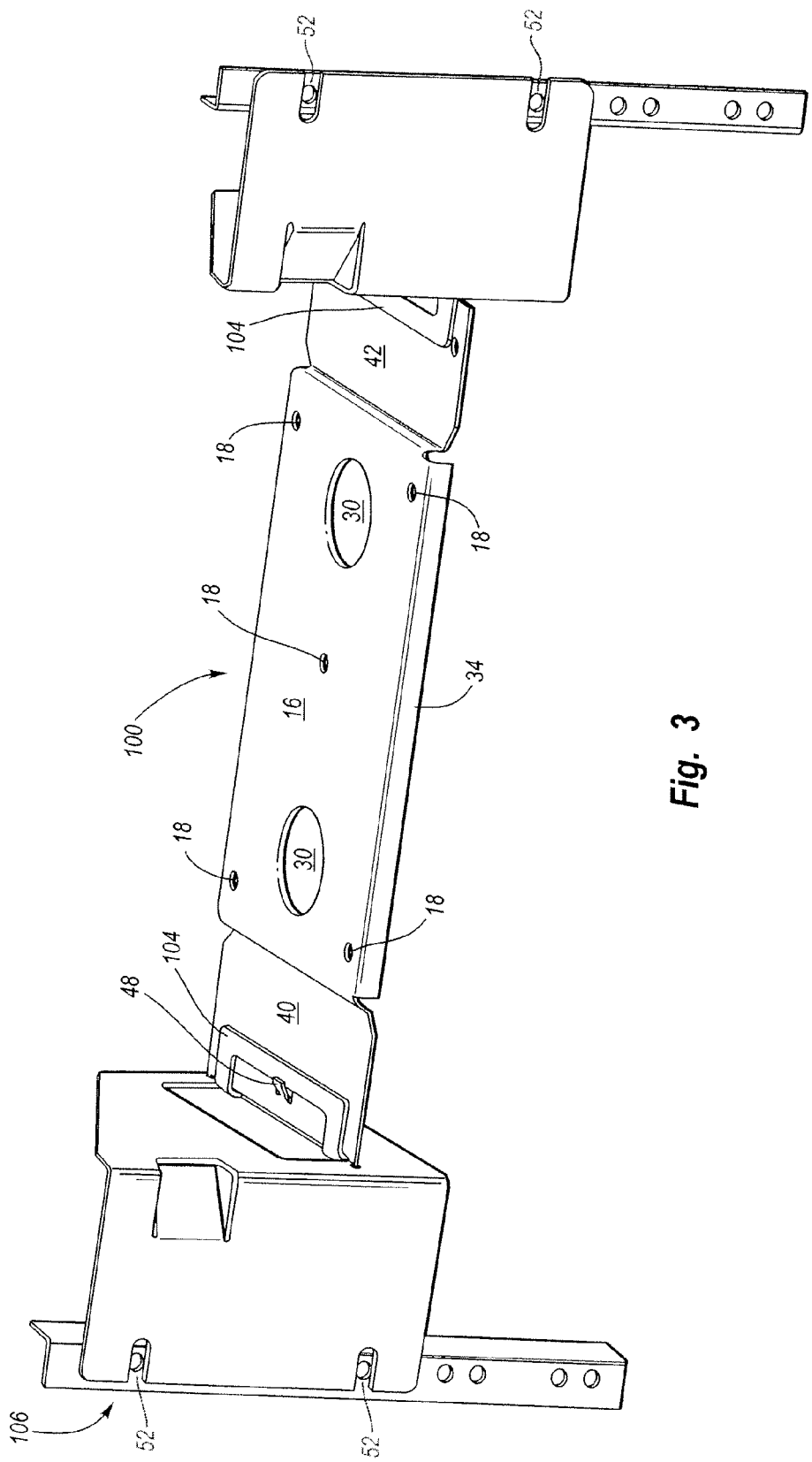
FIG. 3 is a perspective view of the mounting bracket of FIG. 2 coupled to a support structure in an alternative manner.

Referring to FIG. 3, the mounting bracket 100 of FIG. 2 is shown in a horizontal position. Each ear member 40, 42 includes a horizontal clip 48 that engages a bar member 104 of a support structure 106. An ear member 40, 42 may further include additional horizontal clips 48 for additional coupling. The horizontal clips 48 extend toward the mounting face 16 but may also be embodied as extending away from the mounting face 16. The mounting bracket 10 of FIG. 1 may also be disposed in a horizontal position with its horizontal clips 48 engaged with bar members 104 in the same manner. FIG. 3 illustrates the offset position of the mounting face 16 relative to the ear members 40, 42. A hardware component secured to the mounting 16 rests in a horizontal position which may be desired based on space and design constraints.

Figure 4:
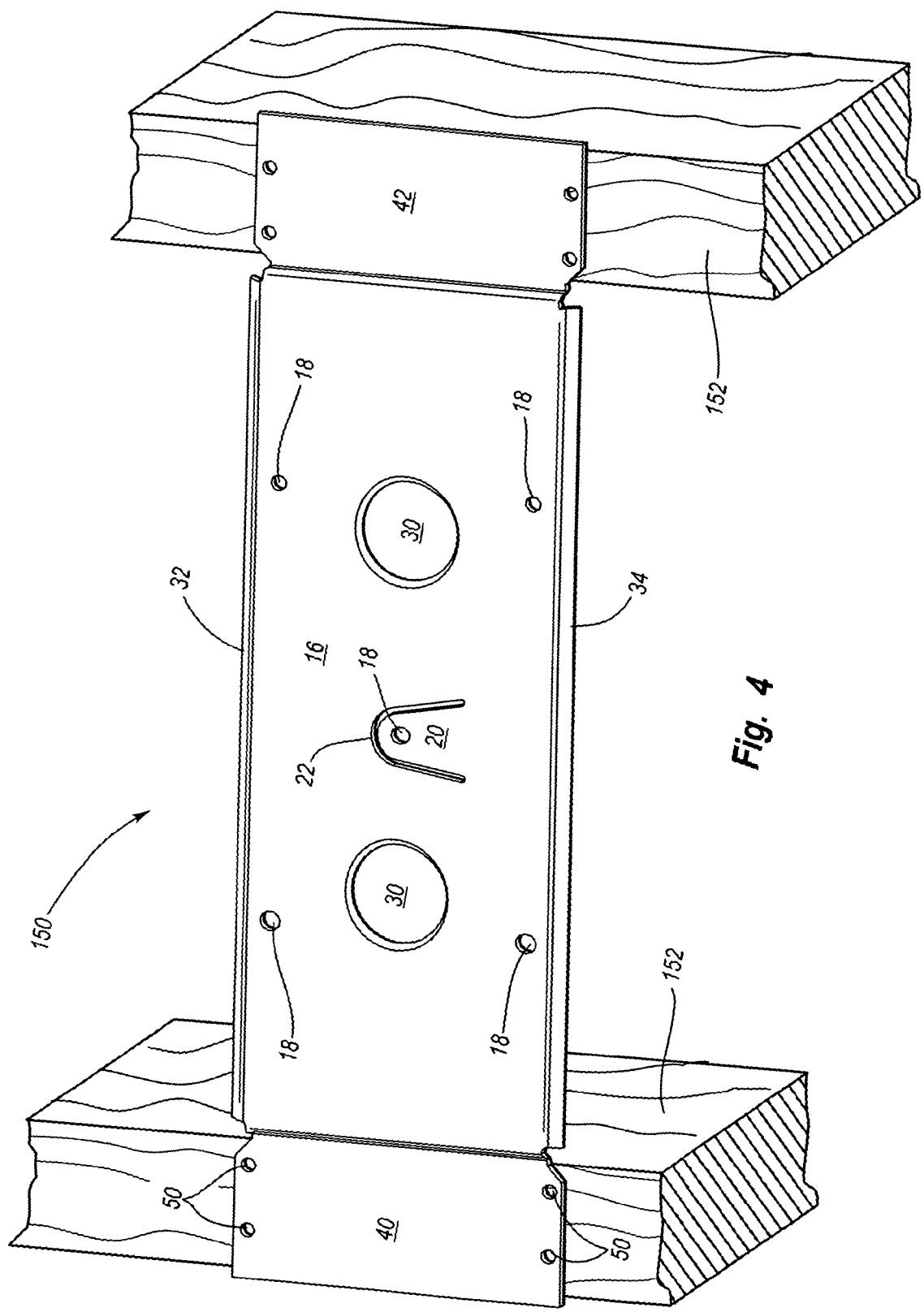
FIG. 4 is a perspective view of an alternative embodiment of a mounting bracket.

Referring to FIG. 4, an alternative embodiment of a mounting bracket 150 is shown in position relative to a support structure 152. The support structure 152 is a pair of wooden studs and the mounting bracket 150 is sized to appropriately position the mounting apertures 50. As can be appreciated the studs may also be metal or other suitable material. In FIG. 4, four mounting apertures 50 are used but this number may be varied.

The mounting bracket 150 does not include a central clip 24, outer clips 44, inner clips 46, or horizontal clips 48. As can be appreciated, in an alternative embodiment, the mounting bracket 150 may include these clips for alternative coupling to support structures. Central, outer, and inner clips 24, 44, 46 may be removed or bent into a position to allow the ear members 40, 42 to remain flush with studs.

Figure 5:
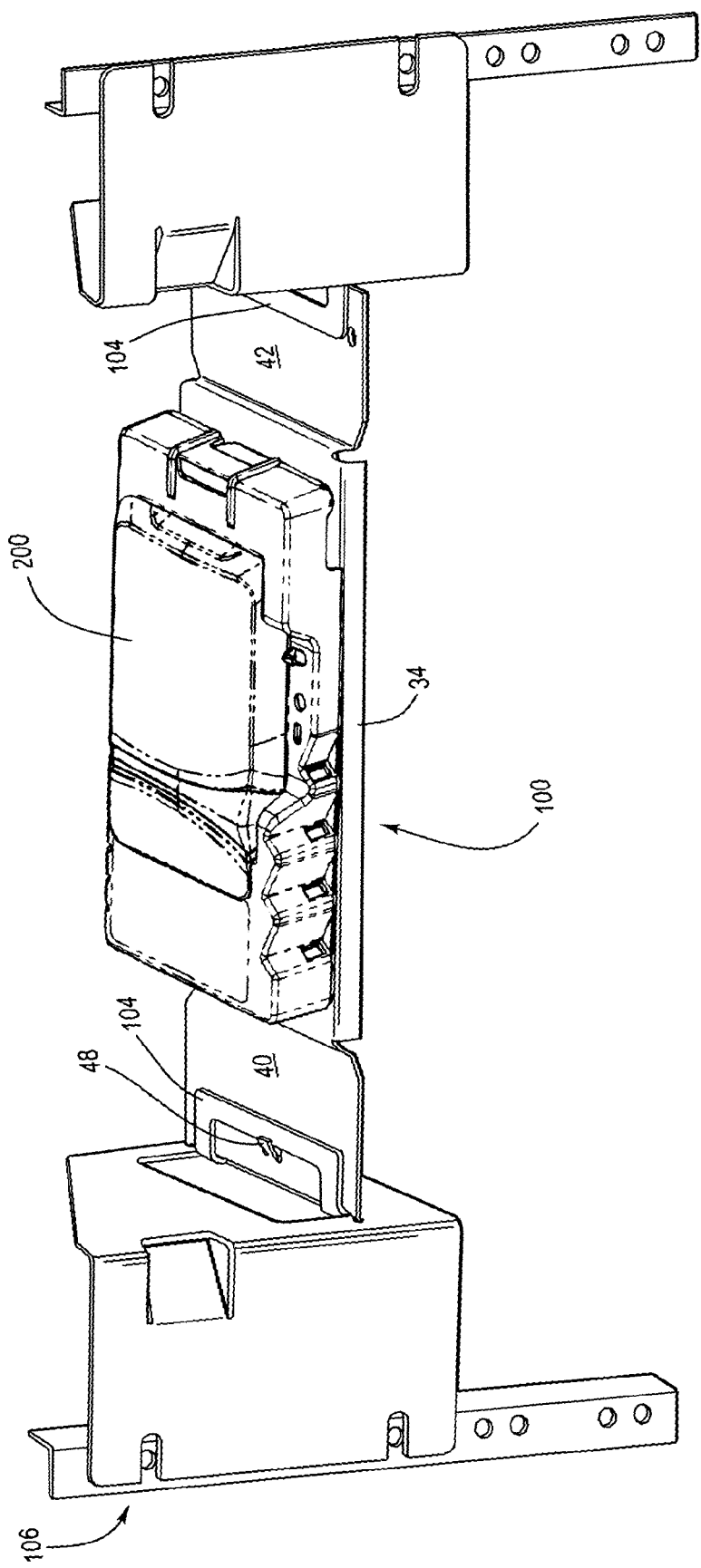
FIG. 5 is a perspective view of an embodiment of a mounting bracket with an exemplary hardware device attached.

Referring to FIG. 5, the mounting bracket 100 of FIGS. 2 and 3 is shown with a chassis assembly 200 coupled thereto. The chassis assembly 200 may house and support computer hardware components including processors, memory, interface devices, ports, and the like. Hardware components may be integrated within one or more boards disposed within the assembly 200. The chassis assembly 200 couples to the mounting bracket 100 through use of the mounting apertures 18. The mounting apertures 18 may couple directly to the assembly 200 or a computer board within the assembly 200 through use of a screw, clip, prong, or other fastening device. One of skill in the art will appreciate that in addition to the assembly 200 any number of computer components may likewise be secured to the mounting bracket 100.

The invention disclosed herein provides a mounting bracket for supporting a hardware component such as a server, router, processing module, memory, or any one of a number of devices. The mounting bracket is able to couple to different support structures to provide versatility in installation in a residence or office building. Thus, a mounting bracket may be vertically or horizontally coupled to a support structure. A mounting bracket may be coupled to a panel with receiving apertures, bar members, or even wall studs.

While specific embodiments and applications of the present invention have been illustrated and described, it is to be understood that the invention is not limited to the precise configuration and components disclosed herein. Various modifications, changes, and variations apparent to those of skill in the art may be made in the arrangement, operation, and details of the methods and systems of the present invention disclosed herein without departing from the spirit and scope of the present invention.

What is claimed is:

1. A mounting bracket to engage and support a hardware component and couple to a support structure:
   a mounting face to couple to the hardware component;
   a first coupling member coupled to the mounting face and non-planar with the mounting face;
   a second coupling member coupled to the mounting face and non-planar with the mounting face;
   a first ear member coupled to the first coupling member and non-planar with the mounting face and the first coupling member, and extending substantially parallel to the mounting face, the first ear member including,
      a clip to engage an aperture in the support structure,
      a horizontal clip to engage a bar member of the support structure and position the mounting bracket substantially in a horizontal plane, and
      a mounting aperture to receive a fastener for coupling to the support structure; and
   a second ear member coupled to the second coupling member and non-planar with the mounting face with the second coupling member, and extending substantially parallel to the mounting face, and substantially planar with the first ear member, the second ear member including,
      a clip to engage an aperture in the support structure,
      a horizontal clip to engage a bar member of the support structure and position the mounting bracket substantially in a horizontal plane, and
      a mounting aperture to receive a fastener for coupling to the support structure.

2. The mounting bracket of claim 1 wherein the mounting face includes a mounting aperture to receive a fastener to enable coupling of the hardware component to the mounting face.

3. The mounting bracket of claim 1 wherein the mounting face includes a central clip to engage an aperture in the support structure.

4. The mounting bracket of claim 3 wherein the mounting face includes a clip spring and wherein the central clip is coupled to the clip spring.

5. The mounting bracket of claim 1 wherein the mounting face includes an alignment spring and a central mounting aperture disposed on the alignment spring.

6. The mounting bracket of claim 1 where in the mounting face includes a structural aperture.

7. The mounting bracket of claim 1 wherein the ear members include an inlet.

8. A mounting bracket to engage and support a hardware component and couple to a support structure:
a mounting face to couple to the hardware component;
a first coupling member coupled to the mounting face;
a second coupling member coupled to the mounting face;
a first ear member coupled to the first coupling member such that the first ear member is substantially parallel to the mounting face including,
a clip to engage an aperture in the support structure, and
a horizontal clip to engage a bar member of the support structure and
position the mounting bracket substantially in a horizontal plane; and a second ear member coupled to the second coupling member such that the second ear member is substantially parallel to the mounting face including,
a clip to engage an aperture in the support structure, and
a horizontal clip to engage a bar member of the support structure and position the mounting bracket substantially in a horizontal plane.

9. The mounting bracket of claim 8 wherein the mounting face includes a mounting aperture to receive a fastener to enable coupling of the hardware component to the mounting face.

10. The mounting bracket of claim 8 wherein the mounting face includes a central clip to engage an aperture in the support structure.

11. The mounting bracket of claim 10 wherein the mounting face includes a clip spring and wherein the central clip is coupled to the clip spring.

12. The mounting bracket of claim 8 wherein the mounting face includes an alignment spring and a central mounting aperture disposed on the alignment spring.

13. The mounting bracket of claim 8 where in the mounting face includes a structural aperture.

14. The mounting bracket of claim 8 wherein the ear members include an inlet.

15. A mounting bracket to engage and support a hardware component and couple to a support structure:
a mounting face to couple to the hardware component;
a first coupling member coupled to the mounting face and non-planar with the mounting face;
a second coupling member coupled to the mounting face and non-planar with the mounting face;
a first ear member coupled to the first coupling member and non-planar with the mounting face and the first coupling member, and extending substantially parallel to the mounting face, the first ear member including,
a clip to engage an aperture in the support structure, and
a horizontal clip to engage a bar member of the support structure and
position the mounting bracket substantially in a horizontal plane; and
a second ear member coupled to the second coupling member and non-planar with the mounting face and the second coupling member, and extending substantially parallel to the mounting face, and substantially planar with the first ear member, the second ear member including,
a clip to engage an aperture in the support structure, and
a horizontal clip to engage a bar member of the support structure and
position the mounting bracket substantially in a horizontal plane.

16. The mounting bracket of claim 15 wherein the mounting face includes a mounting aperture to receive a fastener to enable coupling of the hardware component to the mounting face.

17. The mounting bracket of claim 15 wherein the mounting face includes a central clip to engage an aperture in the support structure.

18. The mounting bracket of claim 17 wherein the mounting face includes a clip spring and wherein the central clip is coupled to the clip spring.

19. The mounting bracket of claim 15 wherein the mounting face includes an alignment spring and a central mounting aperture disposed on the alignment spring.

20. The mounting bracket of claim 15 where in the mounting face includes a structural aperture.

21. The mounting bracket of claim 15 wherein the ear members include an inlet.

22. A mounting bracket to engage and support a hardware component and couple to a support structure:
a mounting face to couple to the hardware component and including a central clip to engage an aperture in the support structure;
a first coupling member coupled to the mounting face and non-planar with the mounting face;
a second coupling member coupled to the mounting face and non-planar with the mounting face;
a first ear member coupled to the first coupling member and non-planar with the mounting face and the first coupling member, and extending substantially parallel to the mounting face, the first ear member including,
a clip to engage an aperture in the support structure, and
mounting aperture to receive a fastener for coupling to the support
structure; and
a second ear member coupled to the second coupling member and non-planar with the mounting face and the second coupling member, and extending substantially parallel to the mounting face, and substantially planar with the first ear member, the second ear member including,
a clip to engage an aperture in the support structure, and
a mounting aperture to receive a fastener for coupling to the support structure.

23. The mounting bracket of claim 22 wherein the mounting face includes a clip spring and wherein the central clip is coupled to the clip spring.

24. The mounting bracket of claim 22 wherein the mounting face includes an alignment spring and a central mounting aperture disposed on the alignment spring.

25. The mounting bracket of claim 22 wherein the ear members include an inlet.

* * * * *

UNITED STATES PATENT AND TRADEMARK OFFICE
CERTIFICATE OF CORRECTION

| | | |
|---|---|---|
| PATENT NO. | : 7,398,949 B2 | Page 1 of 1 |
| APPLICATION NO. | : 11/056526 | |
| DATED | : July 15, 2008 | |
| INVENTOR(S) | : Jonathan C. Weech et al. | |

It is certified that error appears in the above-identified patent and that said Letters Patent is hereby corrected as shown below:

Column 1, Lines 18-19 please remove "; and" from lines 18 and 19 and insert it at the end of line 21 in place of the "."

Column 1, Line 36 reads, "...FIGS. 1 through 4..." which should read "...FIGS. 1 through 5..."

Column 5, Line 17 claim 8 "a second ear member" should begin its own line

Column 5, Line 37 claim 13 reads, "...claim 8 where in..." which should read "...claim 8 wherein..."

Column 5, Line 55 claim 15, run next line to immediately after "and" rather than as a new line and further indent subsequent words through "plane; and"

Column 6, Lines 5-6 claim 15, run next line to immediately after "and" rather than as a new line and further indent subsequent words through "plane."

Column 6, Line 39 claim 22 reads, "...mounting aperture to receive..." which should read "...a mounting aperture to receive..."

Column 6, Lines 40-41 claim 22, remove further indention before "the" and more "structure; and" to end of previous line ending with "support"

Signed and Sealed this

Nineteenth Day of May, 2009

JOHN DOLL
*Acting Director of the United States Patent and Trademark Office*